United States Patent
Halls et al.

(10) Patent No.: US 8,829,494 B2
(45) Date of Patent: Sep. 9, 2014

(54) ORGANIC THIN FILM TRANSISTOR

(75) Inventors: Jonathan James Michael Halls, Cambridge (GB); Craig Edward Murphy, Teddington (GB); Kiyotaka Mori, Bracknell (GB)

(73) Assignees: Cambridge Display Technology Limited, Cambridgeshire (GB); Panasonic Corporation, Osaka (JP)

( * ) Notice: Subject to any disclaimer, the term of this patent is extended or adjusted under 35 U.S.C. 154(b) by 282 days.

(21) Appl. No.: 12/933,675

(22) PCT Filed: Mar. 12, 2009

(86) PCT No.: PCT/GB2009/000668
§ 371 (c)(1),
(2), (4) Date: Dec. 2, 2010

(87) PCT Pub. No.: WO2009/115772
PCT Pub. Date: Sep. 24, 2009

(65) Prior Publication Data
US 2011/0101320 A1   May 5, 2011

(30) Foreign Application Priority Data

Mar. 19, 2008 (GB) ................... 0805112.0

(51) Int. Cl.
*H01L 51/00* (2006.01)
*H01L 51/40* (2006.01)
*H01L 29/08* (2006.01)
*H01L 51/10* (2006.01)
*C08G 61/12* (2006.01)
*H01L 51/05* (2006.01)

(52) U.S. Cl.
CPC ........... *H01L 51/105* (2013.01); *H01L 51/0545* (2013.01); *H01L 51/0022* (2013.01); *C08G 2261/92* (2013.01); *C08G 61/126* (2013.01); *C08G 2261/3223* (2013.01); *C08G 2261/1424* (2013.01); *H01L 51/0037* (2013.01); *H01L 51/102* (2013.01); *H01L 51/0541* (2013.01)
USPC ......... 257/40; 257/E51.005; 438/99

(58) Field of Classification Search
USPC ............................................. 257/40
See application file for complete search history.

(56) References Cited

U.S. PATENT DOCUMENTS 6,963,080 B2 * 11/2005 Afzali-Ardakani et al. .... 257/40
2004/0007758 A1 * 1/2004 McCreery ...................... 257/522
(Continued)

FOREIGN PATENT DOCUMENTS

EP  1 398 840  3/2004
EP  1 508 924  2/2005
(Continued)

OTHER PUBLICATIONS

High-Performanc Bottom Electrode Organic Thin-Film Transistors, Dimitrakopoulus et al., IEEE, vol. 48. No. 6, Jun. 2001, pp. 1060-1064.*
Influence of Tail-Group Hydrogen Bonding on the Stabilities of SAM of Alkylthiols on Gold, Cooper et al., Langmuir 199, 15, pp. 1024-1032.*
Combined Search and Examination Report for GB 085112.0, dated Jun. 19, 2008.
(Continued)

*Primary Examiner* — Asok K Sarkar
*Assistant Examiner* — Igwe U Anya
(74) *Attorney, Agent, or Firm* — Marshall, Gerstein & Borun LLP

(57) ABSTRACT

An organic thin film transistor comprising source and drain electrodes, an organic semiconductor disposed in a channel region between the source and drain electrodes, a gate electrode, and a dielectric disposed between the source and drain electrodes and the gate electrode, wherein the source electrode and the drain electrode comprise at least one different physical and/or material property from each other.

29 Claims, 8 Drawing Sheets

(56) References Cited

U.S. PATENT DOCUMENTS

| | | | |
|---|---|---|---|
| 2004/0012018 A1 | 1/2004 | Tanabe | |
| 2004/0031964 A1 | 2/2004 | Morita et al. | |
| 2004/0161873 A1* | 8/2004 | Dimitrakopoulos et al. | 438/99 |
| 2005/0056897 A1* | 3/2005 | Kawasaki et al. | 257/359 |
| 2005/0133782 A1 | 6/2005 | Klauk et al. | |
| 2005/0269568 A1 | 12/2005 | Koo et al. | |
| 2006/0237731 A1 | 10/2006 | Furukawa et al. | |
| 2006/0289858 A1* | 12/2006 | Park et al. | 257/40 |
| 2007/0194386 A1* | 8/2007 | Hahn et al. | 257/368 |
| 2007/0252229 A1 | 11/2007 | Fujimorl et al. | |
| 2007/0278478 A1* | 12/2007 | Zaumseil et al. | 257/40 |
| 2007/0284571 A1 | 12/2007 | Doi et al. | |
| 2008/0312109 A1* | 12/2008 | Schimmel et al. | 508/100 |
| 2009/0001361 A1* | 1/2009 | Shiba et al. | 257/40 |
| 2012/0025184 A1* | 2/2012 | Naya et al. | 257/40 |

FOREIGN PATENT DOCUMENTS

| | | |
|---|---|---|
| EP | 1 732 150 A1 | 12/2006 |
| EP | 2 202 787 A1 | 6/2010 |
| JP | 2004-055654 A | 2/2004 |
| JP | 2004-356320 A | 12/2004 |
| JP | 2007-294704 A | 11/2007 |

OTHER PUBLICATIONS

International Search Report for PCT/GB2009/000668, dated May 15, 2009.

Written Opinion of the International Search Authority for PCT/GB2009/000668, dated May 15, 2009.

Brown et al., "Built-In Field Electroabsorption Spectroscopy of Polymer Light-Emitting diodes Incorporating a Dope Poly (3,4-Ethylene Dioxythiophene) Hole Injection Layer," Appl. Physics Ltrs., 75(12)1679-1681 (1999).

Chou et al., "Excimer Laser Irradiation Induced Suppression of Off-State Leakage Current in Organic Transistors," Appl. Phys. Ltrs., 90:222103-1-222103-3 (2007).

Kang et al., "Energy Level Diagrams of $C_{60}$/Pentacene/Au and Pentacene/$C_{60}$/Au," Synth. Metals, 156(1):32-37 (2006).

Kim et al. "Improved Contact Properties for Organic Thin-Film Transistors Using Self-Assembled Monolayer," Japanese J. Appl. Phys., 43(1A/B), L60-L62 (2004).

Schroeder et al., "Electrode Specific Electropolymerization of Ethylenedioxythiophene: Injection Enhancement in Organic Transistors," Appl. Phys. Ltrs., 87(11):113501-1-113501-2 (2006).

International Preliminary Report on Patentability for PCT/GB2009/000668, dated Sep. 21, 2010.

Examination Report for Application No. GB0805112.0, dated Jul. 15, 2011.

* cited by examiner

ORGANIC THIN FILM TRANSISTOR

The present invention relates generally to organic thin film transistors and in particular to the physical and material properties of a source and drain electrode forming part of the organic thin film transistor.

Transistors can be divided into two main types: bipolar junction transistors and field-effect transistors. Both types share a common structure comprising three electrodes with a semiconductive material disposed therebetween in a channel region. The three electrodes of a bipolar junction transistor are known as the emitter, collector and base, whereas in a field-effect transistor the three electrodes are known as the source, drain and gate. Bipolar junction transistors may be described as current-operated devices as the current between the emitter and collector is controlled by the current flowing between the base and emitter. In contrast, field-effect transistors may be described as voltage-operated devices as the current flowing between source and drain is controlled by the voltage between the gate and the source.

Transistors can also be classified as p-type and n-type according to whether they comprise semiconductive material which conducts positive charge carriers (holes) or negative charge carriers (electrons) respectively. The semiconductive material may be selected according to its ability to accept, conduct, and donate charge. The ability of the semiconductive material to accept, conduct and donate holes or electrons can be enhanced by doping the material.

For example, a p-type transistor device can be formed by selecting a semiconductive material which is efficient at accepting, conducting, and donating holes, and selecting a material for the source and drain electrodes which is efficient at injecting and accepting holes from the semiconductive material. Good energy-level matching of the Fermi-level in the electrodes with the HOMO level of the semiconductive material can enhance hole injection and acceptance. In contrast, an n-type transistor device can be formed by selecting a semiconductive material which is efficient at accepting, conducting, and donating electrons, and selecting a material for the source and drain electrodes which is efficient at injecting electrons into, and accepting electrons from, the semiconductive material. Good energy-level matching of the Fermi-level in the electrodes with the LUMO level of the semiconductive material can enhance electron injection and acceptance.

Transistors can be formed by depositing the components in thin films to form a thin film transistor (TFT). When an organic material is used as the semiconductive material in such a device, it is known as an organic thin film transistor (OTFT).

OTFTs may be manufactured by low cost, low temperature methods such as solution processing. Moreover, OTFTs are compatible with flexible plastic substrates, offering the prospect of large-scale manufacture of OTFTs on flexible substrates in a roll-to-roll process.

With reference to FIG. 1, the general architecture of a bottom-gate organic thin film transistor (OTFT) comprises a gate electrode 12 deposited on a substrate 10. An insulating layer 11 of dielectric material is deposited over the gate electrode 12 and source and drain electrodes 13, 14 are deposited over the insulating layer 11 of dielectric material. The source and drain electrodes 13, 14 are spaced apart to define a channel region therebetween located over the gate electrode 12. An organic semiconductor (OSC) material 15 is deposited in the channel region for connecting the source and drain electrodes 13, 14. The OSC material 15 may extend at least partially over the source and drain electrodes 13, 14.

Alternatively, it is known to provide a gate electrode at the top of an organic thin film transistor to form a so-called top-gate organic thin film transistor. In such an architecture, source and drain electrodes are deposited on a substrate and spaced apart to define a channel region therebetween. A layer of an organic semiconductor material is deposited in the channel region to connect the source and drain electrodes and may extend at least partially over the source and drain electrodes. An insulating layer of dielectric material is deposited over the organic semiconductor material and may also extend at least partially over the source and drain electrodes. A gate electrode is deposited over the insulating layer and located over the channel region.

An organic thin film transistor can be fabricated on a rigid or flexible substrate. Rigid substrates may be selected from glass or silicon and flexible substrates may comprise thin glass or plastics such as poly(ethylene-terephthalate) (PET), poly(ethylene-naphthalate) PEN, polycarbonate and polyimide.

The organic semiconductive material may be made solution processable through the use of a suitable solvent. Exemplary solvents include mono- or poly-alkylbenzenes such as toluene and xylene; tetralin; and chloroform. Preferred solution deposition techniques include spin coating and ink jet printing. Other solution deposition techniques include dip-coating, roll printing and screen printing.

The length of the channel defined between the source and drain electrodes may be up to 500 microns, but preferably the length is less than 200 microns, more preferably less than 100 microns, most preferably less than 20 microns.

The gate electrode can be selected from a wide range of conducting materials for example a metal (e.g. gold) or metal compound (e.g. indium tin oxide). Alternatively, conductive polymers may be deposited as the gate electrode. Such conductive polymers may be deposited from solution using, for example, spin coating or ink jet printing techniques and other solution deposition techniques discussed above.

The insulating layer comprises a dielectric material selected from insulating materials having a high resistivity. The dielectric constant, k, of the dielectric is typically around 2-3 although materials with a high value of k are desirable because the capacitance that is achievable for an OTFT is directly proportional to k, and the drain current ID is directly proportional to the capacitance. Thus, in order to achieve high drain currents with low operational voltages, OTFTs with thin dielectric layers in the channel region are preferred.

The dielectric material may be organic or inorganic. Preferred inorganic materials include $SiO_2$, $SiN_x$ and spin-on-glass (SOG). Preferred organic materials are generally polymers and include insulating polymers such as poly vinylalcohol (PVA), polyvinylpyrrolidine (PVP), acrylates such as polymethylmethacrylate (PMMA) and benzocyclobutanes (BCBs) available from Dow Corning. The insulating layer may be formed from a blend of materials or comprise a multi-layered structure.

The dielectric material may be deposited by thermal evaporation, vacuum processing or lamination techniques as are known in the art. Alternatively, the dielectric material may be deposited from solution using, for example, spin coating or ink jet printing techniques and other solution deposition techniques discussed above.

If the dielectric material is deposited from solution onto the organic semiconductor, it should not result in dissolution of the organic semiconductor. Likewise, the dielectric material should not be dissolved if the organic semiconductor is deposited onto it from solution. Techniques to avoid such dissolution include: use of orthogonal solvents for example use of a solvent for deposition of the uppermost layer that does not dissolve the underlying layer; and cross linking of the underlying layer.

The thickness of the insulating layer is preferably less than 2 micrometers, more preferably less than 500 nm.

For ease of manufacture it is known to fabricate the source and drain electrodes from the same material. Typically a suitable material such as gold is deposited by thermal evaporation upon a suitable substrate and then patterned to define the source and drain electrodes using standard photolithography and lift off techniques as are known in the art.

With reference to FIG. 2, an energy level diagram for a known OTFT represents a source and drain electrode 16, 17 formed of gold with a workfunction of 4.8 eV. An OSC material 18 such as a small molecule or polymer material is represented with a workfunction of 5.3 eV. A problem arises in that the greater workfunction of 5.3 eV of the OSC 18 represents a barrier to an injection of holes from the gold source electrode 16 into the OSC 18. There is no significant barrier to an extraction of holes at the gold drain electrode 17 and at reverse bias or non-use conditions the difference in workfunction values between the OSC 18 and the drain electrode 17 acts as a barrier to leakage currents.

Alternatively and as illustrated in FIG. 3, the workfunction of the OSC 18 can be tuned to closely match the workfunction of both the source and drain electrodes 16, 17. In such an arrangement, there is no significant barrier to the injection or extraction of holes to and from the OSC 18. However, in reverse bias or non-use conditions there is no barrier between the OSC 18 and source or drain electrodes 16, 17 to leakage currents.

There is therefore a need for an improved organic thin film transistor where the source and drain electrodes are both adapted to the properties of organic semiconductor material used.

According to a first aspect of the present invention, there is provided an organic thin film transistor comprising source and drain electrodes, an organic semiconductor disposed in a channel region between the source and drain electrodes, a gate electrode and a dielectric disposed between source and drain electrodes and gate electrode, wherein the source electrode and the drain electrode comprise at least one different physical and/or material property from each other.

The present invention therefore provides a source and drain electrode which differ from each other in some physical or material property. These differing or "asymmetric electrodes" can be individually tailored to have specific electronic properties. The asymmetry allows for improved charge injection from the source electrode while allowing optimisation of charge extraction at the drain electrode. Advantages include higher mobility, lower contact resistance, lower leakage and a higher on-off ratio.

Preferably the different physical and/or material property is a physical structure provided by a patterned surface feature. The patterned surface features can be raised surface features and/or indentations which encourage crystallisation of the organic semiconductor material. Such patterned surface features are preferably selected from a sawtooth profile, castellations and concave or convex profiles. In order to provide directed crystallisation growth, the source electrode may comprise a patterned surface feature along an edge adjacent the channel region and the drain electrode comprises a patterned surface feature along an edge adjacent the channel region offset from the patterned surface feature of the source electrode such that raised surface features of one electrode are paired with indented surface features of the other electrode.

Preferably, the different physical structures are formed by stamping or photolithography.

Other preferred different physical properties include a different surface area of electrode, a different shape of electrode and a different surface treatment of electrode. Preferably, the surface treatment comprises an addition of a self-assembled monolayer.

A preferred different material property is a different material composition of the source and drain electrodes which can provide a different workfunction of source and drain electrodes.

In order to provide a device with efficient charge injection and extraction in addition to low leakage the source electrode has a workfunction greater than or equal to the workfunction of the organic semiconductor and the drain electrode has a workfunction lower than the organic semiconductor.

Preferred materials for the source and drain electrodes include metals and conducting organic materials such as a small molecule, a polymer or poly(ethylene dioxythiophene). The conducting organic material may be deposited by any one of inkjet printing, spin coating or stamp printing.

Preferably, the different material composition of the source and drain electrodes comprises oxidised portions of the source and drain electrodes. Such oxidised portions may comprise an oxygen compound such as oxides of Mo, MoCr, W or V or more particularly oxidised portions comprise MoCr-oxide, MoO3, WO3 or V2O5.

An asymmetric organic thin film transistor may comprise source and drain electrodes comprising a bilayer of at least two overlapping layers and wherein an upper layer of the bilayer is positionally offset from a lower layer. Preferably, an upper layer of the source electrode bilayer overlaps and is adjacent the channel region of the transistor and the lower layer of the drain electrode bilayer is adjacent the channel region of the transistor. Alternatively, an upper layer of the drain electrode bilayer overlaps and is adjacent the channel region of the transistor and the lower layer of the source electrode bilayer is adjacent the channel region of the transistor.

Patterning of the source and/or drain electrode can provide a transistor with a larger effective channel width than if the source and/or drain electrode was not patterned. According to a second aspect of the present invention, there is therefore provided an organic thin film transistor comprising source and drain electrodes, an organic semiconductor disposed in a channel region between the source and drain electrodes, a gate electrode and a dielectric disposed between source and drain electrodes and gate electrode, wherein one or both of the source electrode and the drain electrode are patterned to provide an increased effective channel width contact area at the interface between the organic semiconductor and patterned electrode.

The organic thin film transistor can be a top-gate or bottom-gate transistor.

According to a third aspect of the present invention, there is provided a method of fabricating an organic thin film transistor comprising source and drain electrodes with a channel region therebetween, a gate electrode, a dielectric layer disposed between the source and drain electrodes and the gate electrode, and an organic semiconductor disposed in the channel region between the source and drain electrodes, the method comprising providing a source and drain electrode that have at least one different physical and/or material property from each other.

Embodiments of the invention will now be described, by way of example only, and with reference to the accompanying drawings in which.

Figure 10:
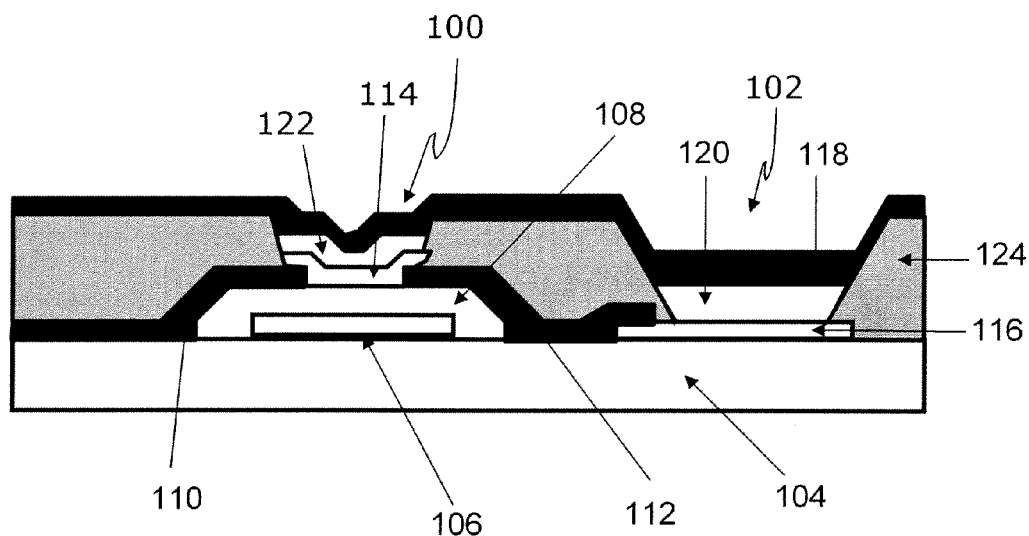
Figure 11:
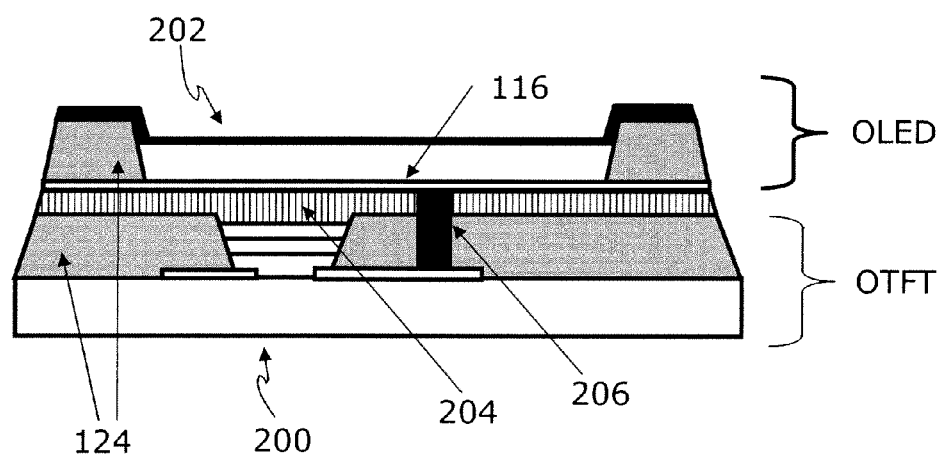

FIG. 10 is a schematic diagram of a pixel comprising an organic thin film transistor and an adjacent organic light emitting device fabricated on a common substrate according to an embodiment of the present invention; and FIG. 11 is a schematic diagram of an organic thin film transistor fabricated in a stacked relationship to an organic light emitting device according to an embodiment of the present invention.

Throughout the following description like reference numerals shall be used to identify like parts.

Figure 1:
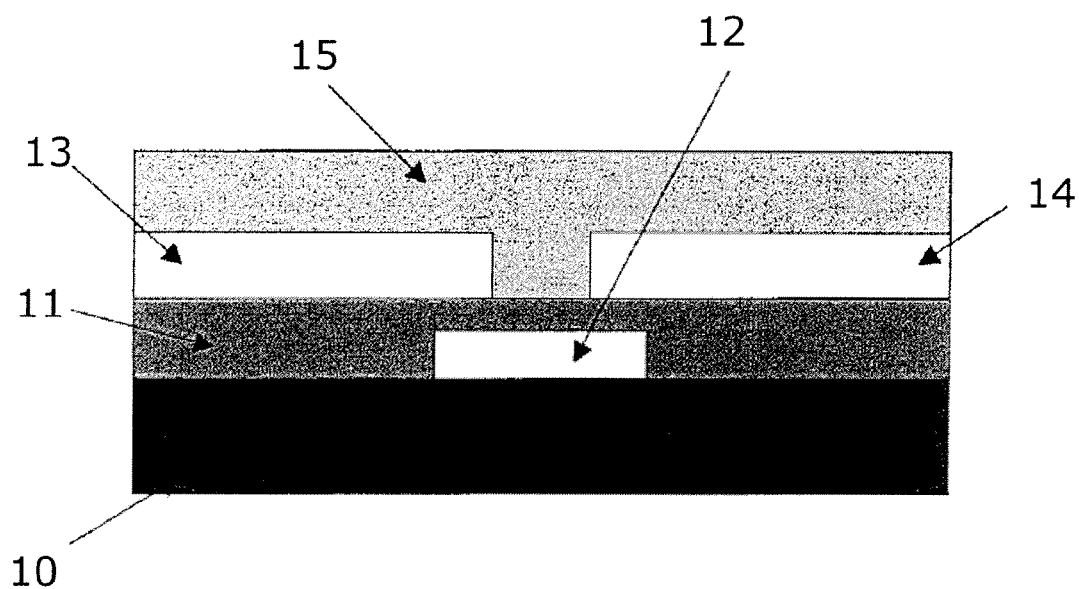
FIG. 1 is a schematic diagram of a general architecture of a bottom-gate organic thin film transistor according to the prior art.
Figure 2:
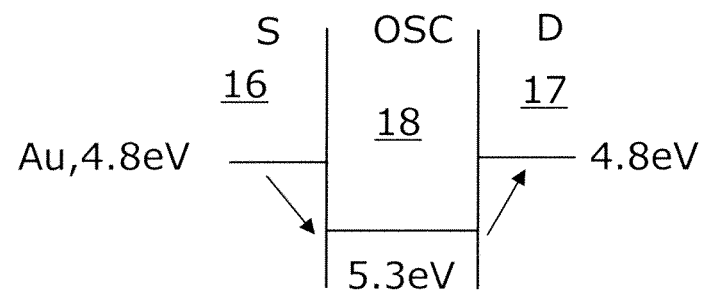
FIG. 2 is a first energy level diagram for an organic thin film transistor according to the prior art.
Figure 3:
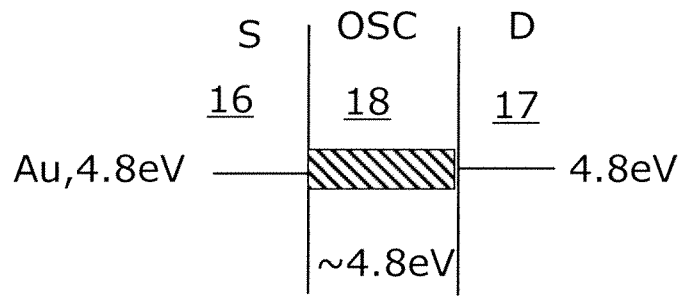
FIG. 3 is a second energy level diagram for an organic thin film transistor according to the prior art.
Figure 4:
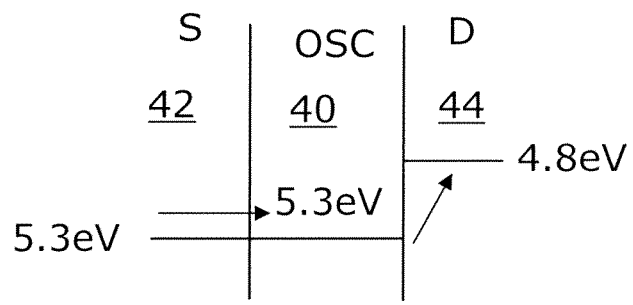
FIG. 4 is a first energy level diagram for an organic thin film transistor having asymmetric source and drain electrodes according to an embodiment of the present invention.

Referring to FIG. 4, a first energy level diagram for an organic thin film transistor having asymmetric source and drain electrodes according to an embodiment of the present invention comprises an organic semiconductor material 40 having a workfunction of 5.3 eV. Preferred organic semiconductor materials 40 include small molecules such as optionally substituted pentacene; optionally substituted polymers such as polyarylenes, in particular polyfluorenes and polythiophenes; and oligomers. Blends of materials, including blends of different material types (e.g. a polymer and small molecule blend) may be used.

A source electrode 42 is provided with a workfunction of 5.3 eV matching that of the organic semiconductor material 40. A drain electrode 44 is provided with a workfunction of 4.8 eV below that of the organic semiconductor material 40.

A conductive organic material such as a conductive polymer is deposited as the source electrode 42 and the drain electrode 44 is deposited as a metal such as gold. Alternatively both electrodes can be conductive polymers with a workfunction tuned to the desired value. An example of such a conductive polymer is poly(ethylene dioxythiophene) (PEDOT) although other conductive polymers are known in the art. Such conductive polymers may be deposited from solution using, for example, spin coating or ink jet printing techniques.

Alternatively or in combination for up-channel organic thin film transistor, the source 42 and drain 44 electrodes can be appropriately selected from a high workfunction material, preferably a metal, with a workfunction of greater than 3.5 eV, for example gold, platinum, palladium, molybdenum, tungsten, or chromium selected for the required workfunction. Other suitable compounds, alloys and oxides such as molybdenum trioxide and indium tin oxide may also be used.

Figure 5:
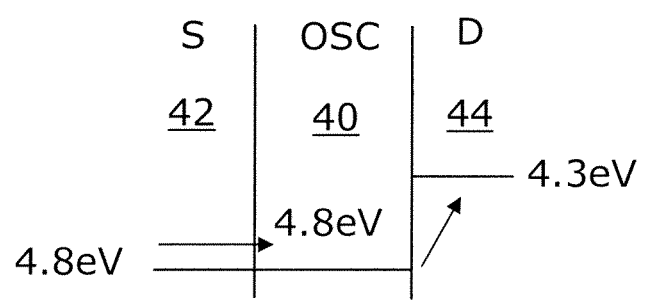
FIG. 5 is a second energy level diagram for an organic thin film transistor having asymmetric source and drain electrodes according to an embodiment of the present invention.

As best seen in FIG. 5, an organic semiconductor material 40 comprises a workfunction of 4.8 eV. Accordingly, a source electrode 42 is selected as gold, Au, having a workfunction of 4.8 eV matching that of the organic semiconductor material 40. Additionally, a drain electrode 44 is selected as silver, Ag, having a workfunction of 4.3 eV.

In both of the examples discussed above in relation to FIGS. 4 and 5, the source electrode is selected to have a workfunction matching that of the organic semiconductor material for efficient charge injection and carrier mobility. The drain electrode is selected to have a workfunction below that of the organic semiconductor material so that charge extraction is not impeded and so that there exists a barrier to leakage currents in reverse bias or non-use conditions.

For an n-channel OTFT, preferably the source and drain electrodes comprise a material, for example a metal having a workfunction of less than 3.5 eV such as calcium or barium or a thin layer of metal compound, in particular an oxide or fluoride of an alkali or alkali earth metal for example lithium fluoride, barium fluoride and barium oxide. Alternatively, conductive polymers may be deposited as the source and drain electrodes.

One technique to deposit an asymmetric source and drain electrode is to firstly deposit a source electrode metal by evaporation through a first mask onto a substrate. The source electrode metal may be gold and deposited by thermal evaporation. A second deposition is performed of the drain electrode metal using a second mask to form the drain electrode. The drain electrode may be silver and also deposited by thermal evaporation. Subsequently, an organic semiconductor material is deposited by a solution deposition technique such as spin coating or ink jet printing into a conductive channel between source and drain electrodes. The organic semiconductor layer is dried using a thermal treatment process.

Figure 6:
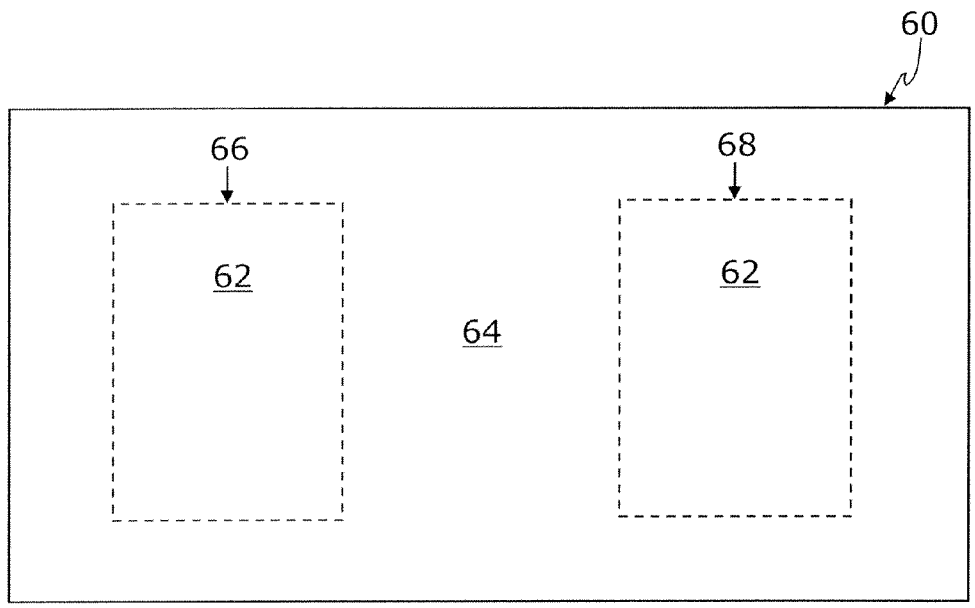
FIG. 6 is a schematic diagram of an asymmetric source and drain electrode according to an embodiment of the present invention.
Figure 6:
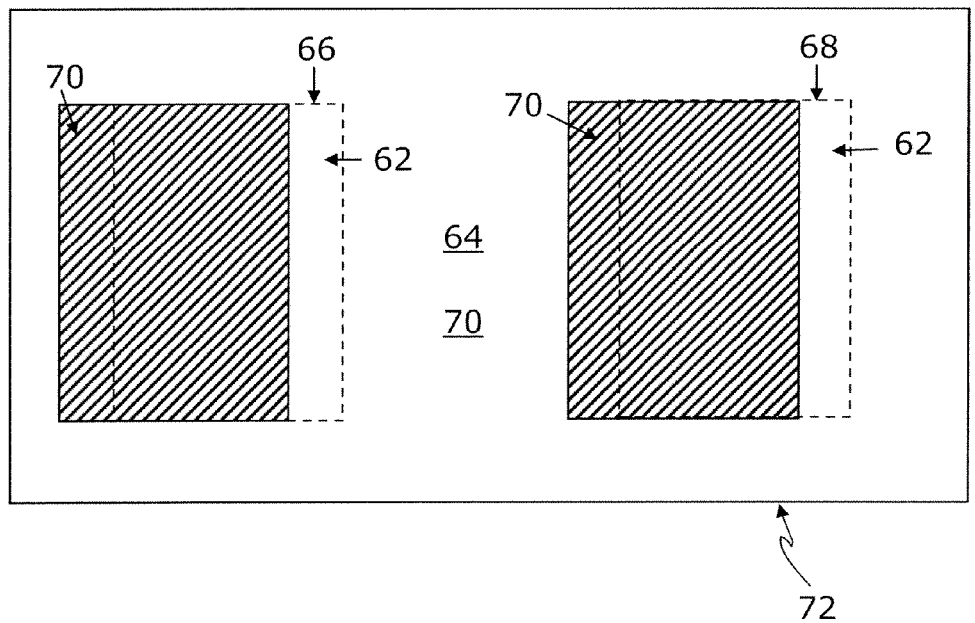

Referring to FIG. 6, a schematic diagram of a precursor 60 to an asymmetric source and drain electrode arrangement 72 comprises a patterned NiCr adhesion layer 62 (shown as a dashed outline) deposited upon a glass substrate 64. Typically the NiCr adhesion layer 62 serves to aid the subsequent adhesion of a further metal 70 (shown as hatched pattern) put down as identical source and drain electrodes 66, 68. However according to an embodiment of the present invention, the NiCr adhesion layer 62 serves to both provide adhesion and also to form an asymmetric source electrode 66 and drain electrode 68. As will be appreciated by a person skilled in the art, NiCr could be replaced by any other suitable contact electrode material for the purpose of this embodiment.

In FIG. 6, the further metal 70 has been offset deposited upon the patterned NiCr adhesion layer 62. Accordingly, in the case of the source electrode 66 a portion of the underlying NiCr adhesion layer 62 protrudes from the overlying further metal 70 layer and in the case of the drain electrode 68, the overlying further metal 70 layer protrudes from the underlying NiCr adhesion later 62.

Subsequently, an organic semiconductor material (not shown in FIG. 6) is deposited over the source and drain electrodes 66, 68 to fill a channel 70 between the source and drain electrodes 66, 68. The metal closest to the channel 70 for the source electrode 66 is NiCr and the metal closest to the channel 70 for the drain electrode 68 is the further metal 70.

The metal closest to the channel 70 dominates the electrical characteristics of the electrode.

Figure 7A:
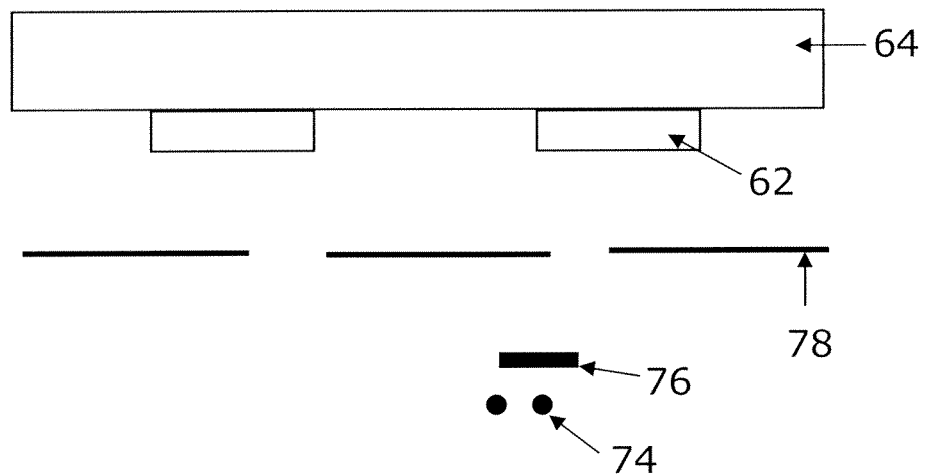
FIGS. 7a and 7b are schematic diagrams of a method of forming an asymmetric source and drain electrode using an offset source according to an embodiment of the present invention.
Figure 7B:
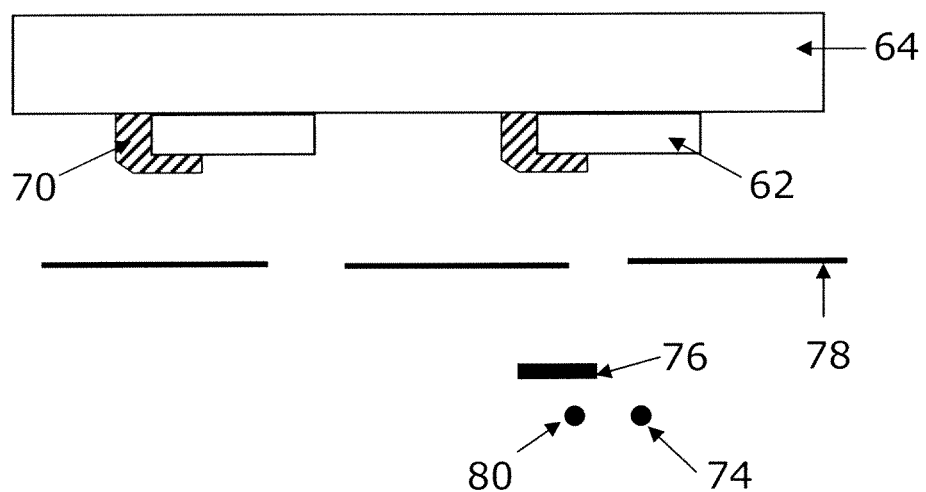

With reference to FIGS. 7a and 7b, we describe a method of forming an asymmetric source and drain electrode 72 of the type described with reference to FIG. 6 using an offset source according to an embodiment of the present invention.

Referring to FIG. 7a, a glass substrate 64 is exposed to a first NiCr metal source 74 using known line of sight evaporation deposition techniques. A shutter 76 is provided to regulate exposure time and a mask 78 is provided to pattern the NiCr metal upon the glass substrate 64. Following evaporation of the NiCr metal the substrate 64 is therefore provided with a patterned NiCr adhesion layer 62.

Subsequently and with reference to FIG. 7b, the glass substrate 64 is exposed to a further metal source 80 such as Au. The location of the source of the further metal 80 is offset from that of the NiCr metal source 74 and so the Au is deposited over the patterned NiCr adhesion layer 62 in an offset manner also as a patterned layer 70 in order to provide an asymmetric source and drain electrode 66, 68 arrangement 72 as described in FIG. 6.

Figure 8A:
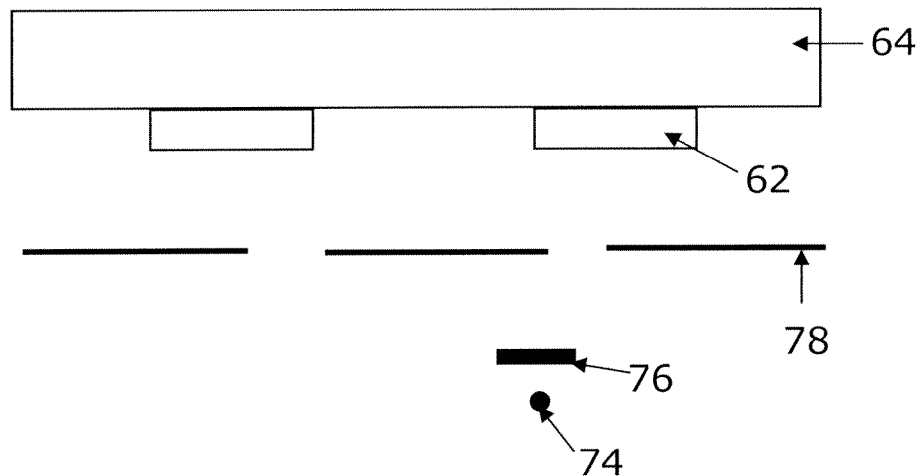
FIGS. 8a and 8b are schematic diagrams of a method of forming an asymmetric source and drain electrode using an offset mask according to an embodiment of the present invention.
Figure 8B:
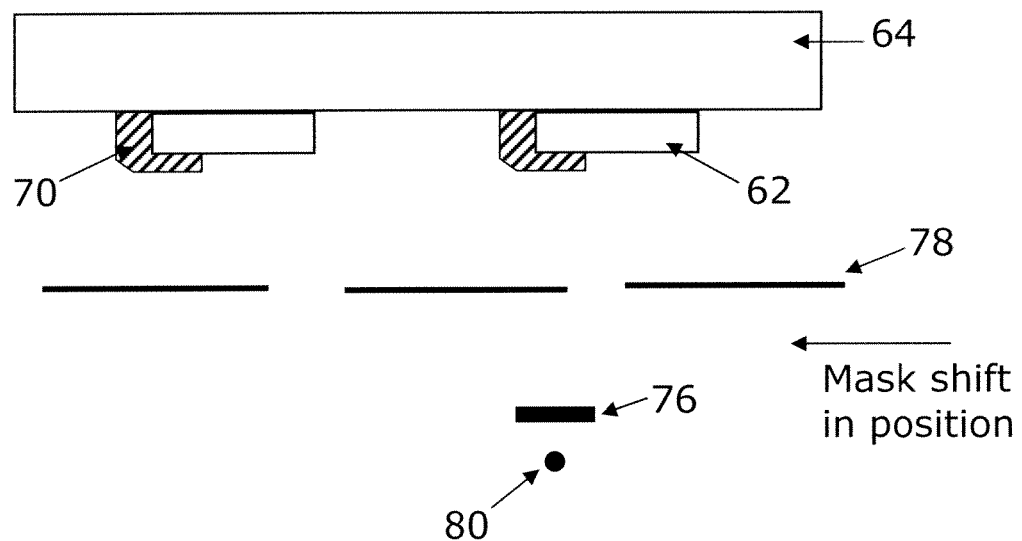

With reference to FIGS. 8a and 8b, we describe a method of forming an asymmetric source and drain electrode of the type described with reference to FIG. 6 using an offset mask according to an embodiment of the present invention.

Referring to FIG. 8a, a glass substrate 64 is exposed to a first NiCr metal source 74 using known line of sight evaporation deposition techniques. A shutter 76 is provided to regulate exposure time and a mask 78 is provided to pattern the NiCr metal upon the glass substrate 64. Following evaporation of the NiCr metal the substrate 64 is provided with a patterned NiCr adhesion layer 62.

Subsequently and with reference to FIG. 8b, the position of the mask 78 is offset by a small amount and the glass substrate 64 is exposed to a further metal source 80 such as gold, Au. The location of the further metal source 80 is fixed in the same position as the NiCr metal source 74. This change of metal source without change of relative position can be achieved through use of a carousel arrangement. The Au is deposited over the patterned NiCr adhesion layer 62 in an offset manner also as a patterned layer 70 in order to provide an asymmetric source and drain electrode 66, 68 arrangement 72 as described in FIG. 6.

In a further embodiment of the present invention, in addition to providing asymmetric electrodes to promote the injection and extraction of charge in an organic thin film transistor, asymmetric electrodes can be used to control organic semiconductor material crystal growth by controlling the extent of nucleation on the surfaces of the source and drain electrodes and particularly along the channel edge.

Asymmetry in the crystal growth and domain size at source and drain electrodes can improve crystal growth across a channel and eliminate grain boundaries caused when crystals grow from each side of the channel and meet towards the middle of the channel. A grain boundary represents an amorphous rather than ordered portion of a crystal and can present a barrier to the mobility of charge through the crystal. The asymmetry in crystal growth can be introduced by differences in physical shape, patterning and surface chemistry between source and drain electrodes in addition to differences in material composition as described above. The asymmetry in nucleation so that the nucleation of crystals is preferred at one of the source and drain electrodes and so that nucleation is promoted at one electrode and suppressed at the other electrode can also introduced by differences in physical shape, patterning and surface chemistry between source and drain electrodes in addition to differences in material composition as described above. This asymmetry in nucleation can cause crystal formation to commence at one electrode, for example the source electrode and progress across the channel to the other electrode, the drain electrode.

Figure 9A:
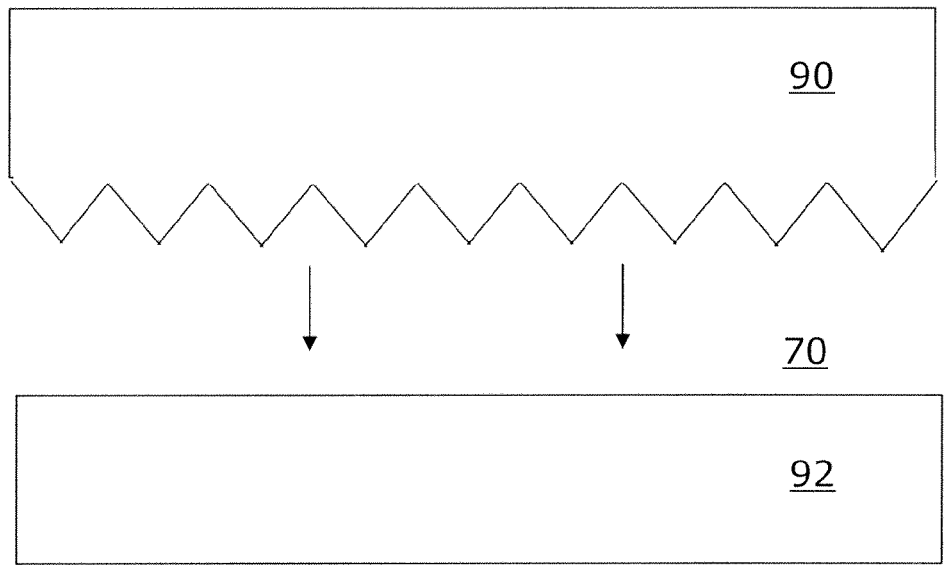
FIGS. 9a and 9b are schematic diagrams of a patterned asymmetric source and drain electrode according to an embodiment of the present invention.

Thus FIG. 9a is a schematic diagram of a patterned asymmetric source and drain electrode according to an embodiment of the present invention where the asymmetry between electrodes arises from a difference in the patterning of the electrodes. A gold, Au source electrode 90 and gold, Au drain electrode 92 are provided having a channel 70 therebetween.

The source electrode 90 is patterned with a structure that promotes nucleation and growth of organic semiconductor crystals. The drain electrode 92 has a linear edge. In this case and as illustrated in FIG. 9a, both electrodes can be fabricated from the same material and can be deposited in a single masked evaporation process or patterned photolithographically via a lift-off procedure. Such patterns can be sawtooth, castellations, concave or convex semidiscs or other suitable shapes.

Figure 9B:
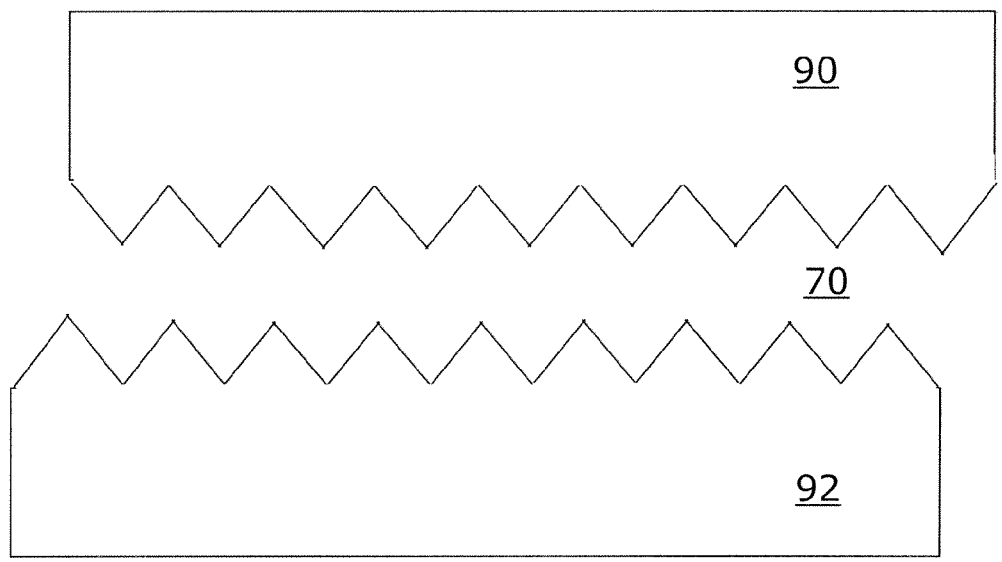

Referring to FIG. 9b, the source electrode 90 comprises an edge sawtooth pattern and the drain electrode 92 is provided with a complementary sawtooth pattern. By providing one electrode with peaks and the other electrode with corresponding troughs encourages the crystallisation in a direction from one electrode to the other. Such a crystallisation growth can result in a material without in boundaries which form when crystallisation proceeds from both electrodes at the same time. Since grain boundaries act as barriers to charge transport and can also act as charge trap sites, both of which can reduce overall charge mobility, such a reduce in the formation of grain boundaries is beneficial to the overall performance of the device.

As seen in FIGS. 9a and 9b the use of a physically patterned electrode structure provides a larger effective width for the transistor, for a given linear width on a device. The larger effective width can allow a use of organic semiconductor materials with lower intrinsic mobility.

In a further embodiment of the present invention, the chemical property or surface energy of the source and drain electrodes can be altered and optimised to promote organic semiconductor crystallisation nucleation and increase the efficiency of charge injection and extraction. Application of a surface treatment to one or both of the source and drain electrodes can be by made by depositing a self-assembled monolayer (SAM) over the source and/or drain electrodes. SAM molecules with polar end groups can be used to provide local wetting and nucleate crystallisation. SAM molecules with hydrophobic end groups (e.g. fluorinated molecules) can be used to provide an anti-wetting "background" that promotes movement of organic semiconductor molecules to the wetting regions. Such SAM molecules can be deposited using ink jet printing. A particularly preferred SAM molecule comprises F4TCNQ.

OTFTs according to embodiments of the present invention have a wide range of possible applications. One such application is to drive pixels in an optical device, preferably an organic optical device. Examples of such optical devices include photoresponsive devices, in particular photodetectors, and light-emissive devices, in particular organic light emitting devices. OTFTs are particularly suited for use with active matrix organic light emitting devices, e.g. for use in display applications.

FIG. 10 shows a pixel comprising an organic thin film transistor 100 and an adjacent organic light emitting device 102 fabricated on a common substrate 104. The OTFT 100 comprises gate electrode 106, dielectric layer 108, source and drain electrodes 110 and 112 respectively, and OSC layer 114. The OLED 102 comprises anode 116, cathode 118 and an electroluminescent layer 120 provided between the anode 116 and cathode 118. Further layers may be located between the anode 118 and cathode 118, such as charge transporting, charge injecting or charge blocking layers. In the embodiment of FIG. 10, the layer of cathode material 118 extends across both the OTFT 100 and the OLED 102, and an insulating layer 122 is provided to electrically isolate the cathode layer 118 from the OSC layer 122. The active areas of the OTFT 100 and the OLED 102 are defined by a common bank material formed by depositing a layer of photoresist 124 on substrate 104 and patterning it to define OTFT 100 and OLED 102 areas on the substrate.

In FIG. 10, the drain electrode 112 is directly connected to the anode 116 of the organic light emitting device 102 for switching the organic light emitting device 102 between emitting and non-emitting states.

In an alternative arrangement illustrated in FIG. 11, an organic thin film transistor 200 may be fabricated in a stacked relationship to an organic light emitting device 202. In such an embodiment, the organic thin film transistor 202 is built up as described above in either a top or bottom gate configuration. As with the embodiment of FIG. 10, the active areas of the OTFT 200 and OLED 202 are defined by a patterned layer of photoresist 124, however in this stacked arrangement, there are two separate bank layers 124—one for the OLED 202 and one for the OTFT 200. A planarisation layer 204 (also known as a passivation layer) is deposited over the OTFT 200. Exemplary passivation layers 204 include BCBs and parylenes. The organic light emitting device 202 is fabricated over the passivation layer 204 and the anode 116 of the organic light emitting device 202 is electrically connected to the drain electrode 112 of the OFTF 200 by a conductive via 206 passing through passivation layer 204 and bank layer 124.

It will be appreciated that pixel circuits comprising an OTFT and an optically active area (e.g. light emitting or light sensing area) may comprise further elements. In particular, the OLED pixel circuits of FIGS. 10 and 11 will typically comprise least one further transistor in addition to the driving transistor shown, and at least one capacitor. It will be appreciated that the organic light emitting devices described herein may be top or bottom-emitting devices. That is, the devices may emit light through either the anode or cathode side of the device. In a transparent device, both the anode and cathode are transparent. It will be appreciated that a transparent cathode device need not have a transparent anode (unless, of course, a fully transparent device is desired), and so the transparent anode used for bottom-emitting devices may be replaced or supplemented with a layer of reflective material such as a layer of aluminium.

Transparent cathodes are particularly advantageous for active matrix devices because emission through a transparent anode in such devices may be at least partially blocked by OTFT drive circuitry located underneath the emissive pixels as can be seen from the embodiment illustrated in FIG. 11.

Thicknesses of the gate electrode, source and drain electrodes may be in the region of 5-200 nm, although typically 50 nm as measured by Atomic Force Microscopy (AFM), for example.

Other layers may be included in the device architecture. For example, in addition to providing a self assembled monolayer (SAM) on the gate, source or drain electrodes one may be provided on the, substrate, insulating layer and organic semiconductor material to promote crystallinity, reduce contact resistance, repair surface characteristics and promote adhesion where required. In particular, the dielectric surface in the channel region may be provided with a monolayer comprising a binding region and an organic region to improve device performance, e.g. by improving the organic semiconductor's morphology (in particular polymer alignment and crystallinity) and covering charge traps, in particular for a high k dielectric surface. Exemplary materials for such a monolayer include chloro- or alkoxy-silanes with long alkyl chains, eg octadecyltrichlorosilane.

No doubt many other effective alternatives will occur to the skilled person. It will be understood that the invention is not limited to the described embodiments and encompasses modifications apparent to those skilled in the art lying within the spirit and scope of the claims appended hereto.

The invention claimed is:

1. An organic thin film transistor comprising source and drain electrodes, an organic semiconductor disposed in a channel region between the source and drain electrodes, a gate electrode, and a dielectric disposed between the source and drain electrodes and the gate electrode, wherein the source and drain electrodes comprise at least one different physical property from each other and the different physical property includes a different surface treatment of electrode, the surface treatment comprising an addition of a self-assembled monolayer having polar end groups, said polar end groups providing local wetting of the organic semiconductor.

2. An organic thin film transistor as claimed in claim 1, wherein the at least one different physical property is a physical structure comprising patterned surface features.

3. An organic thin film transistor as claimed in claim 2, wherein the patterned surface features are raised surface features and/or indentations.

4. An organic thin film transistor as claimed in claim 3, wherein the raised surface features and/or indentations are selected from the group consisting of a sawtooth profile, castellations, concave profiles, and convex profiles.

5. An organic thin film transistor as claimed in claim 4, wherein the source electrode comprises a patterned surface feature along an edge adjacent the channel region and the drain electrode comprises a patterned surface feature along an edge adjacent the channel region offset from the patterned surface feature of the source electrode such that raised surface features of one electrode are paired with indented surface features of the other electrode.

6. An organic thin film transistor as claimed in claim 1, wherein the different physical structures are formed by stamping or photolithography.

7. An organic thin film transistor as claimed in claim 1, wherein the different physical property includes a different surface area of electrode.

8. An organic thin film transistor as claimed in claim 1, wherein the different physical property includes a different shape of electrode.

9. An organic thin film transistor as claimed claim 1, wherein the at least one different physical property is a different material composition of the source and drain electrodes.

10. An organic thin film transistor as claimed in claim 9, wherein the different material composition provides a different workfunction of source and drain electrodes.

11. An organic thin film transistor as claimed in claim 10, wherein the source electrode has a workfunction greater than or equal to the workfunction of the organic semiconductor and the drain electrode has a workfunction lower than the organic semiconductor.

12. An organic thin film transistor as claimed in claim 9, wherein the different material composition of the source and drain electrodes comprises oxidized portions of the source and drain electrodes.

13. An organic thin film transistor as claimed in claim 12, wherein the oxidized portions comprise an oxygen compound.

14. An organic thin film transistor as claimed in claim 13, wherein the oxidized portions comprise oxides of Mo, MoCr, W or V.

15. An organic thin film transistor as claimed in claim 14, wherein the oxidized portions comprise MoCr-oxide, $MoO_3$, $WO_3$ or $V_2O_5$.

16. An organic thin film transistor as claimed in claim 9, wherein the source and drain electrodes comprise a bilayer of at least two overlapping layers and wherein an upper layer of the bilayer is positionally offset from a lower layer.

17. An organic thin film transistor as claimed in claim 16, wherein an upper layer of the source electrode bilayer overlaps and is adjacent the channel region of the transistor and the lower layer of the drain electrode bilayer is adjacent the channel region of the transistor.

18. An organic thin film transistor as claimed in claim 16, wherein an upper layer of the drain electrode bilayer overlaps and is adjacent the channel region of the transistor and the lower layer of the source electrode bilayer is adjacent the channel region of the transistor.

19. An organic thin film transistor as claimed in claim 1, wherein at least one of the source and drain electrodes is a conducting organic material.

20. An organic thin film transistor as claimed in claim 19, wherein the conducting organic material comprises a polymer.

21. An organic thin film transistor as claimed in claim 20, wherein the polymer comprises poly(ethylene dioxythiophene).

22. An organic thin film transistor as claimed in claim 19, wherein the conducting organic material is deposited by any one of inkjet printing, spin coating, and stamp printing.

23. An organic thin film transistor as claimed in claim 1, wherein the organic thin film transistor is a bottom-gate organic thin film transistor.

24. An organic thin film transistor as claimed in claim 1, wherein the organic thin film transistor is a top-gate organic thin film transistor.

25. A method of fabricating an organic thin film transistor comprising source and drain electrodes with a channel region therebetween, a gate electrode, a dielectric layer disposed between the source and drain electrodes and the gate electrode, and an organic semiconductor disposed in the channel region between the source and drain electrodes, the method comprising providing a source electrode and a drain electrode that have at least one different physical property from each other by providing the source or drain electrode with a different surface treatment by depositing a self-assembled monolayer over either the source or the drain electrode, the self-assembled monolayer having polar end groups, said polar end groups providing local wetting of the organic semiconductor.

26. A method as claimed in claim 25, wherein providing a source electrode and a drain electrode that have a different physical property from each other comprises changing the physical structure of at least one electrode.

27. A method as claimed in claim 26, wherein changing the physical structure of at least one electrode comprises surface patterning the electrode.

28. A method as claimed in claim 25, wherein the surface treatment includes seeding a surface of the source electrode and/or the drain electrode with a crystallization region and whereby the organic semiconductor material crystallizes at the crystallization region.

29. A method as claimed in claim 25, wherein providing a source electrode and a drain electrode that have a different physical property from each other further comprises depositing a source electrode with a different workfunction to the drain electrode.

* * * * *